(12) United States Patent
Jung

(10) Patent No.: US 7,061,045 B2
(45) Date of Patent: Jun. 13, 2006

(54) FLASH MEMORY CELL AND METHOD FOR MANUFACTURING THE SAME

(75) Inventor: Myung-Jin Jung, Seoul (KR)

(73) Assignee: DongbuAnam Semiconductor Inc., Seoul (KR)

( * ) Notice: Subject to any disclaimer, the term of this patent is extended or adjusted under 35 U.S.C. 154(b) by 0 days.

(21) Appl. No.: 10/992,989

(22) Filed: Nov. 18, 2004

(65) Prior Publication Data

US 2005/0142743 A1    Jun. 30, 2005

(30) Foreign Application Priority Data

Dec. 31, 2003   (KR)   ...................... 10-2003-0101821

(51) Int. Cl.
*H01L 29/788*   (2006.01)

(52) U.S. Cl. ....................... 257/320; 257/322

(58) Field of Classification Search ................ 257/320, 257/322; 438/257, 263, 266, 295, 299
See application file for complete search history.

(56) References Cited

U.S. PATENT DOCUMENTS 5,837,584 A    11/1998  Lu et al.
5,962,890 A *  10/1999  Sato ........................... 257/320
6,242,305 B1    6/2001  Foote et al.

FOREIGN PATENT DOCUMENTS

KR   1020000004241 A   1/2000

OTHER PUBLICATIONS

Lee, Min Gyu et al., Method for Forming Common Source Lines of Flash EEPROM, English Abstract of Korean Patent Abstract 1020000004241 A, 01-25-2000, Korean Intellectual Property Office, Republic of Korea.

* cited by examiner

*Primary Examiner*—Phuc T. Dang
(74) *Attorney, Agent, or Firm*—Andrew D. Fortney

(57) ABSTRACT

The present invention relates to a flash memory and a method for manufacturing the same, capable of minimizing resistance of the common source line in the flash memory cell manufacturing process. In the memory cell manufacturing method according to the embodiment of the present invention, trench lines are continuously formed on a semiconductor substrate, and gate oxide film lines are formed on the semiconductor substrate except at the trench lines. Sequentially, gate lines vertical with the trench lines are formed on the trench lines and the gate oxide film lines, and the dielectric material of the trench line and the gate dielectric film between adjacent gate lines is removed, and a conductive film of Ti/TiN or Co/Ti/TiN is deposited on the common source region, and then a silicide is formed on the common source region by means of annealing.

25 Claims, 7 Drawing Sheets

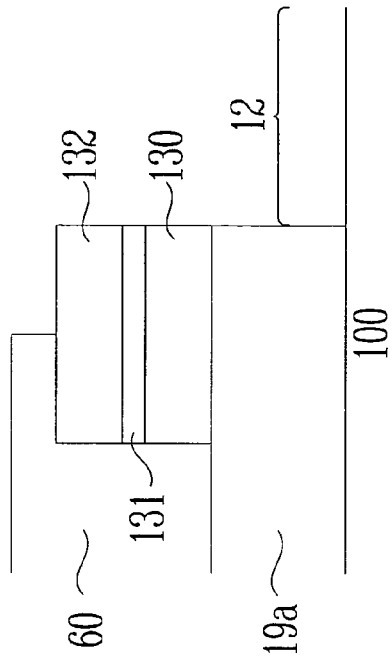
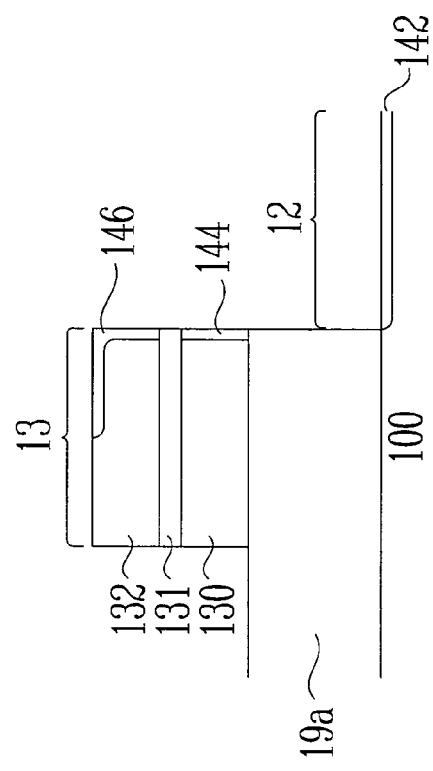
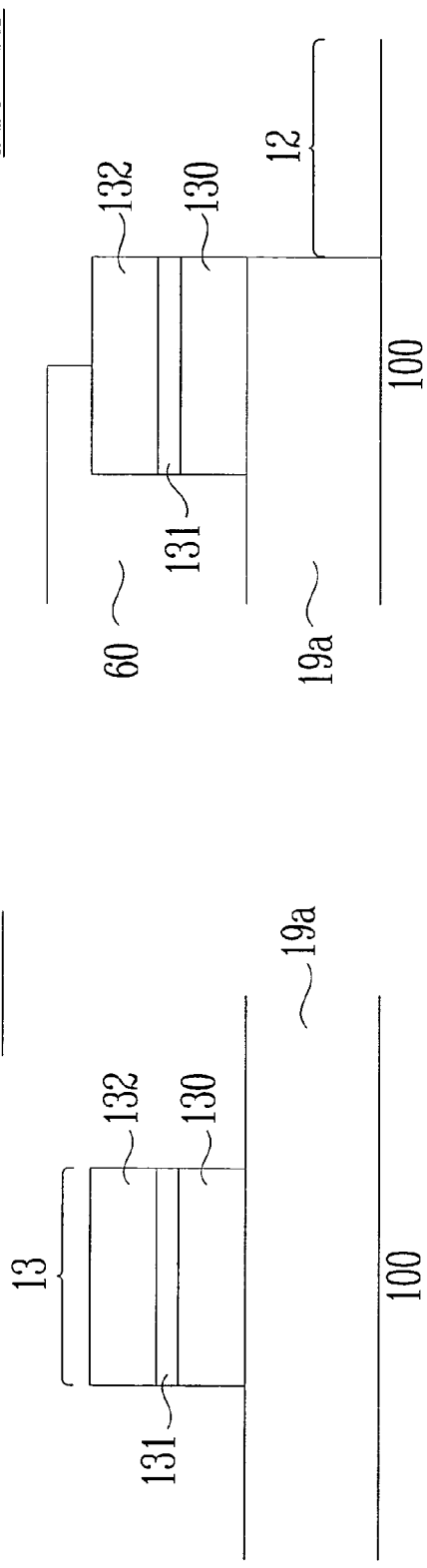
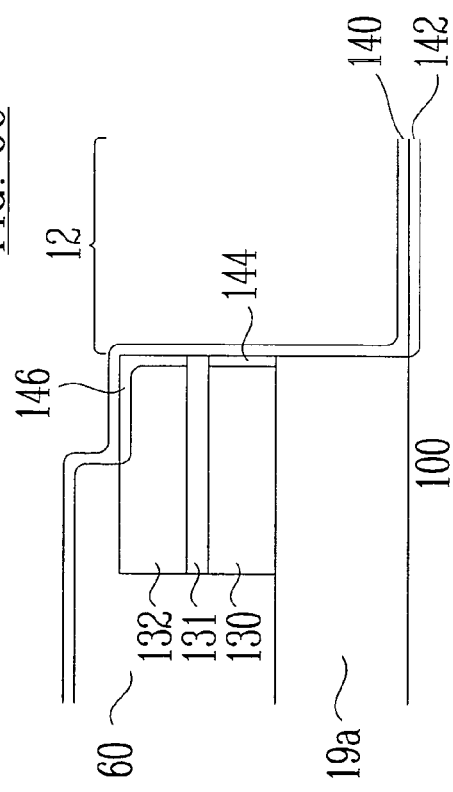

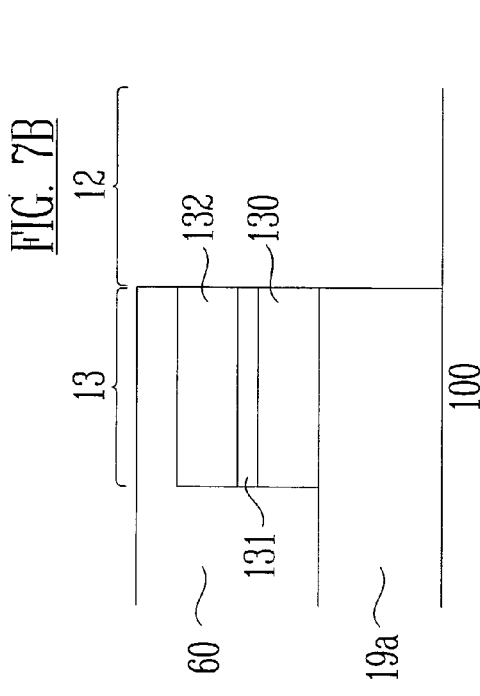
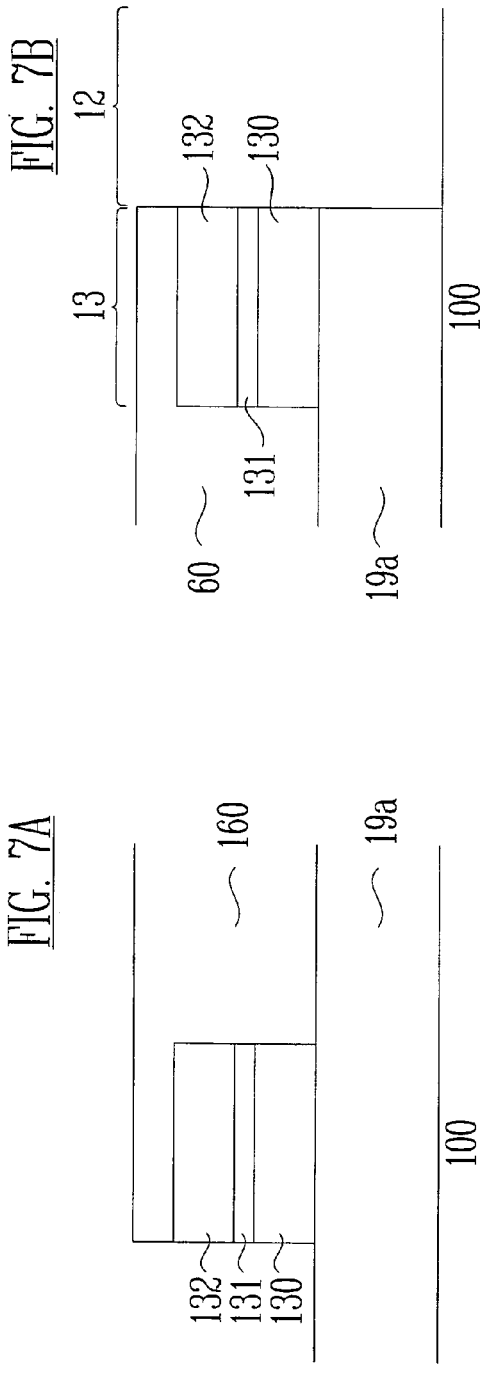
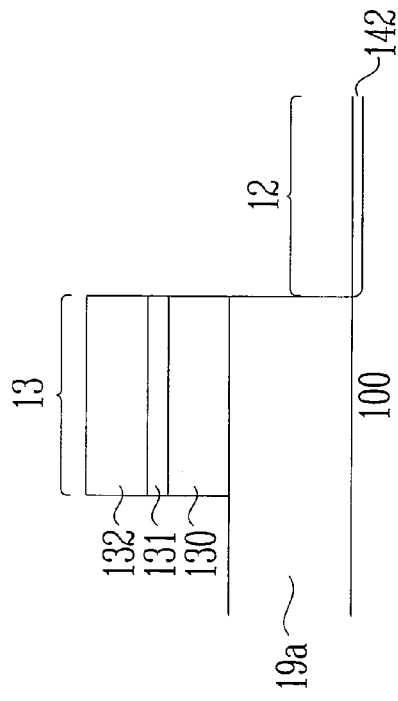
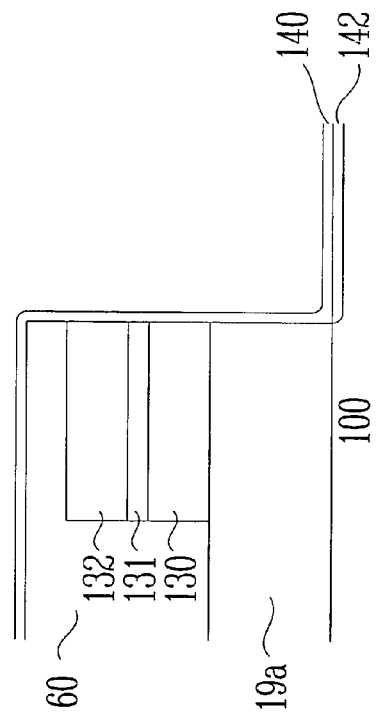

FLASH MEMORY CELL AND METHOD FOR MANUFACTURING THE SAME

BACKGROUND OF THE INVENTION (a) Field of the Invention

The present invention relates to a flash memory cell and a method for manufacturing the same, and in particular, to the flash memory cell and a method for manufacturing the same that are capable of minimizing resistance of the common source line in a fabrication process for an Embedded Flash Memory Cell.

(b) Description of the Related Art

Typically, a flash memory device is manufactured so as to secure the advantages of the EPROM having programmable and erasable characteristics, and the EEPROM having electrically programmable and erasable characteristics. Such a flash memory includes a thin tunnel oxide formed on a silicon substrate, a floating gate and a control gate deposited with an interposed dielectric film, and a source/drain region formed on an exposed area of the substrate, the device storing 1 bit at one transistor and being electrically programmable and erasable.

Such a flash memory device is provided with a source connection layer coupling a source of a unit cell for forming a source line. This source connection layer can be formed by means of a metal contact to the source of the unit cell from an overlying metal line. However, metal contacts from adjoining flash memory cells to an overlying metal common source line may not be appropriate for a large scale integrated circuit in consideration of the contact margin and cell real estate consumed by the metal source line.

Accordingly, in order to implement large scale integration of the device, a source line, which is formed from an impurity diffusion layer through a self aligned source (SAS) process, has recently been adopted. That is, the SAS process may be carried out by exposing a source region of the cell using a SAS mask while or after forming a gate electrode having a layered structure, and removing a field oxide in the exposed source region by anisotropic etching to form the common source line with an adjacent cell.

Such techniques related to the SAS process are disclosed in U.S. Pat. Nos. 5,837,584 and 6,242,305.

FIGS. 1 and 2 are drawings for illustrating the self aligned source (SAS) technique. FIG. 1 is a drawing for illustrating a cell size when the SAS technique is not adopted, and FIG. 2 is a drawing for the cell size when the SAS technique is adopted. In the above-mentioned SAS technique, the cell size shrinks in a bit line (BL) direction; i.e., the gate to source space denoted by reference d in FIG. 1 is eliminated in FIG. 2. It is believed that the SAS technique is an essential process for a commercially competitive 0.25 µm technology. By introducing the SAS technique, the cell size can be reduced by as much as 20%.

In FIG. 1, reference numeral 11 denotes a common source line (e.g., an overlying metal line) over the source region in memory cells which do not adopt the SAS technique, reference numeral 13 denotes a gate line extended in a direction of (e.g., parallel to) a word line (WL), reference numeral 15 denotes a drain, reference numeral 17 denotes a drain contact, and reference numeral 19 denotes a trench line functioning as a device isolation region, formed using shallow trench isolation (STI).

However, the conventional SAS technique depicted in FIG. 2 has a drawback in that the contact resistance of the common source line 12 per cell abruptly increases since the common source line in the memory cell adopting such a SAS technique is formed according to a profile of the trench line. Particularly, in most memory cells manufactured by 0.25 µm, 0.18 µm, or thinner µm technologies, shallow trench isolation (STI) is used as the isolation technique. STI and SAS are essential techniques for reducing the cell size in respective WL and BL directions, but the use of both techniques dramatically increases the source resistance.

Flash memory typically uses a high internal voltage. Thus, with successively smaller generations of process technology, the depth of the trench typically does not decrease in proportion to any decreases in the cell size. Accordingly, the proportional length of the common source line increases such that the cumulative source resistance may have an adverse effect over relatively long distances (e.g., 8, 16, 32 or more cells in a given wordline). Also, in the case of embedded flash, the product can be negatively affected, for example, programming characteristics and reading speed may decrease as a result of such cumulative source resistances.

SUMMARY OF THE INVENTION

The present invention has been made in an effort to solve the above problems, and an object of the present is to provide a flash memory cell capable of minimizing the resistance of a common source line adopting the SAS technique.

Also, it is another object of the present invention to provide a method for manufacturing a flash memory cell capable of minimizing the resistance of the common source line adopting the SAS technique.

To achieve the objects, the present invention provides a flash memory cell and a method for manufacturing the same, as follows.

An embedded flash memory cell may comprises trench lines in a semiconductor substrate; a gate oxide film on the semiconductor substrate in areas other than over the trench lines; gate lines on the trench lines and gate oxide film, the gate lines being perpendicular to the trench lines; a common source line formed between and in parallel with adjacent gate lines, the common source line including a conductive silicide (e.g., salicide), metal and/or metal nitride layer.

The gate lines may include a first polycrystalline silicon layer, a dielectric layer, and a second polycrystalline silicon layer, and/or the dielectric layer may have a layered oxide film-nitride film-oxide film structure. Also, the trench lines may be parallel with a bit line, and the gate lines may be parallel with a word line.

A method for manufacturing the flash memory cell comprises the steps of sequentially forming trench lines in a semiconductor substrate; forming a gate oxide film on the substrate except in areas other than over the trench lines; forming gate lines over the trench lines and the gate oxide film, perpendicular to the trench lines; removing dielectric material of the trench lines and the gate oxide film between adjacent gate lines to define a common source line region; and forming a conductive film in the common source line area.

Preferably, the trench lines are parallel with a bit line and/or the gate lines are parallel with a word line. Preferably, the conductive film comprises a silicide or salicide layer (e.g., by annealing a metal such as W, Ti or Co deposited in the common source region) or a metal nitride (e.g., sequentially layered Ti/TiN or Co/Ti/TiN). When the conductive film comprises a silicide or salicide, the method may further comprise a step of removing a remaining metal and/or metal nitride film after annealing.

BRIEF DESCRIPTION OF THE DRAWINGS

FIGS. 6a to 6d are cross-sectional views, cut along the line A–A' of FIG. 2, for illustrating the steps of forming the common source lines in the method for manufacturing the memory cell in accordance with the present invention; and FIGS. 7a to 7d are cross-sectional views, cut along the line A–A' of FIG. 2, for illustrating the steps of forming the common source lines in an alternative method for manufacturing the memory cell in accordance with the present invention.

DETAILED DESCRIPTION OF THE PREFERRED EMBODIMENTS

Preferred embodiments of the present invention will be described in detail hereinafter with reference to the accompanying drawings.

Figure 1:
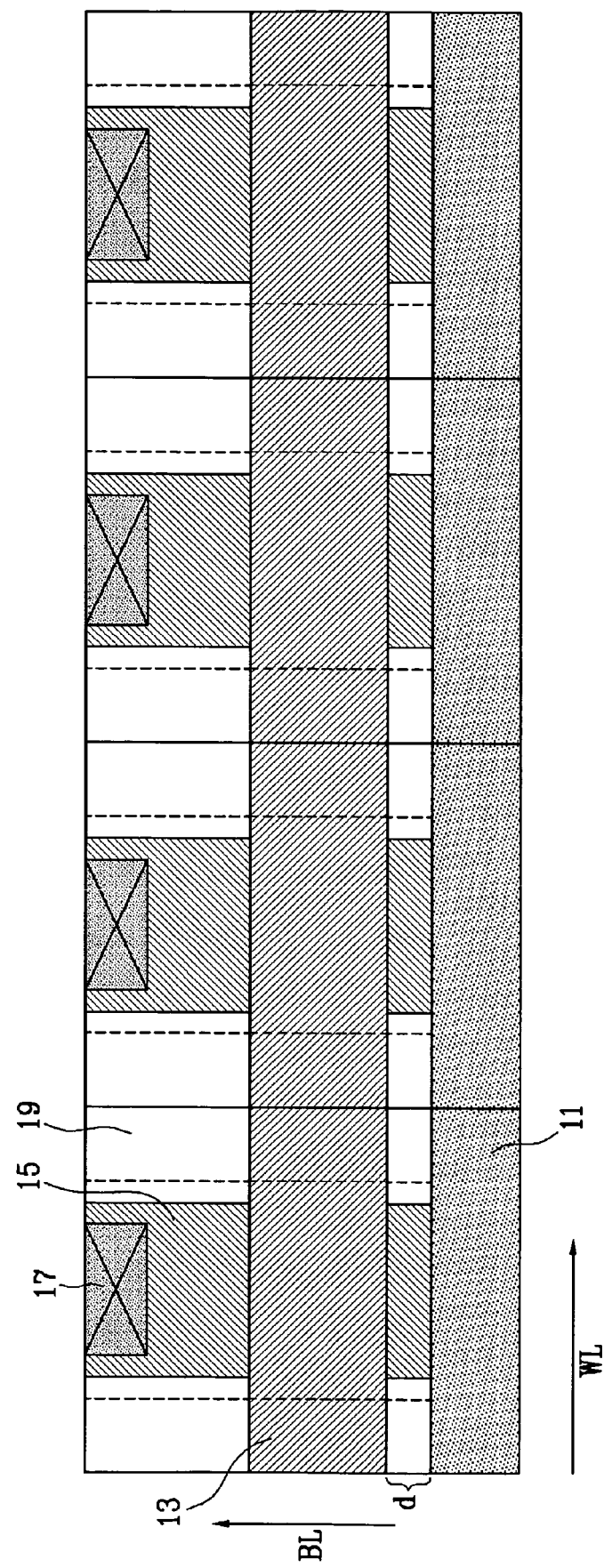
FIG. 1 is a plan view illustrating a structure of a conventional flash memory cell.
Figure 2:
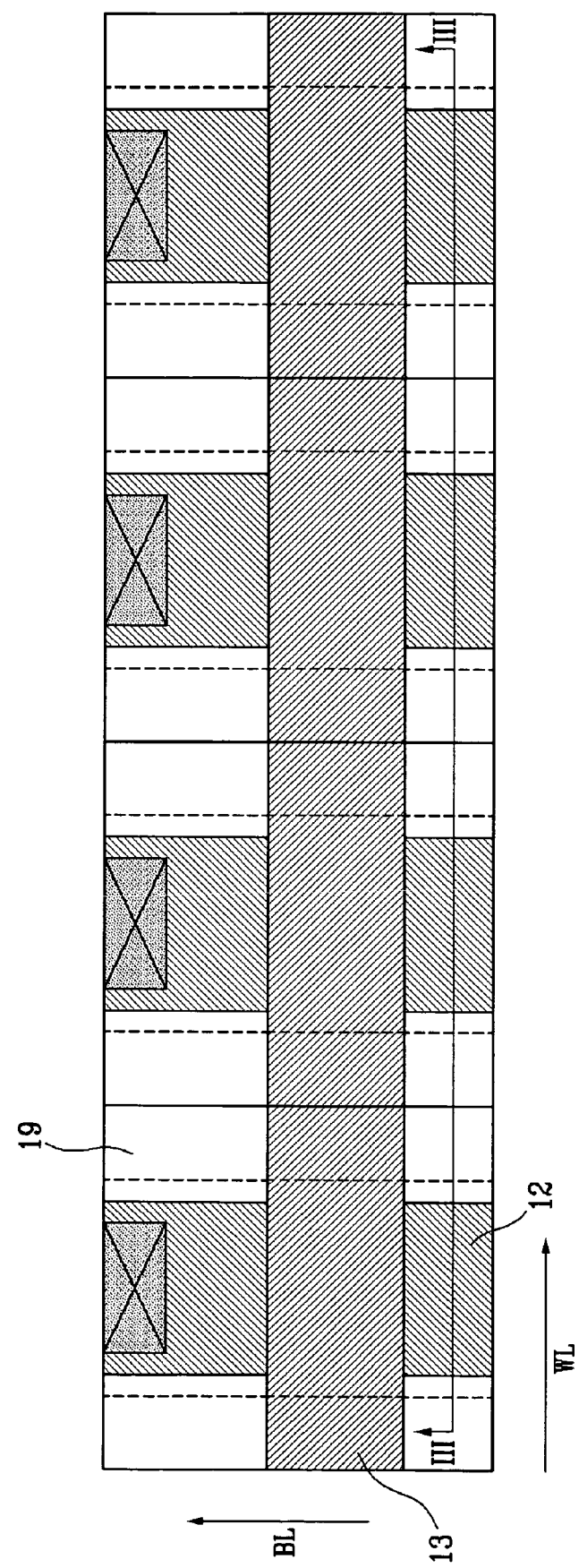
FIG. 2 is a plan view illustrating a structure of a memory cell implemented with the SAS technique.
Figure 3:
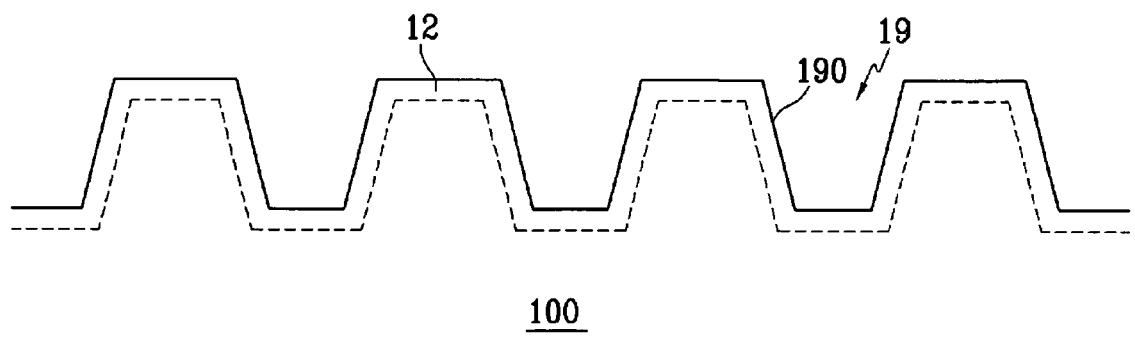
FIG. 3 is a cross-sectional view illustrating a memory cell structure manufactured according to the conventional SAS technique, which is cut along the line III–III' of FIG. 2.

FIG. 3 is a cross-sectional view illustrating a memory cell structure manufactured according to a conventional SAS technique, which is cut along the line III—III of FIG. 2. As shown in FIG. 3, the memory cell manufactured according to the conventional method adopting the SAS technique is provided with a trench 19 corresponding to a device isolation region and a common source line 12 formed by ion injecting impurities in a region for forming the common source line in a word line (WL) direction on the substrate 100. Since the above-structured common source line 12 is formed according to the profile of the trench 19 of the trench line, there is a shortcoming in that the contact resistance of the common source line per cell abruptly increases. In fact, the deeper the trench 19, or the steeper the slope of trench sidewall 190, the worse the voltage drops are from cell to cell along the common source line. This is believed to be because the ion injection (or implantation) density/concentration is lower per unit area along the trench sidewall 190, thus increasing the surface resistance and also the specific resistance of the common source line along the inner wall 190 of the trench.

Figure 4:
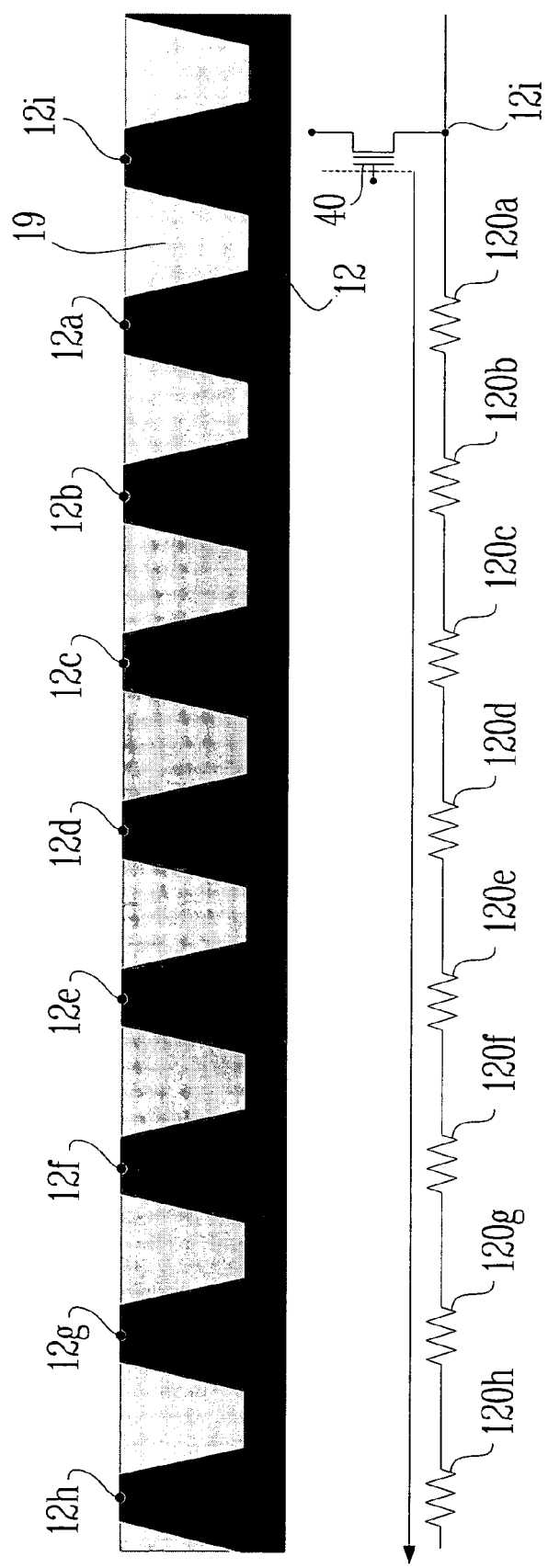
FIG. 4 depicts the cross-sectional view of the SAS line of FIG. 3 and a corresponding circuit schematic demonstrating the cumulative effect of the individual resistances of each SAS line segment in each cell in a wordline.

Referring now to FIG. 4, in one study in which the flash memory array had an operating voltage Vcc=4 V, the common SAS line 12 was formed using conventional ion implantation, and the trench 19 had a depth varying from about 2400 Å to about 4000 Å, it was found that the cumulative Vcc drop as a percentage of the operating voltage was sufficiently high to cause potential read and/or write errors and to adversely affect the speed of the flash memory device. For example, common source line 12 can be viewed as a plurality of source line segments with nodes 12a–h, successively removed from source node 12i of select transistor 40. Each segment has a corresponding resistance 120a–h, as depicted in the schematic of FIG. 4. In the case where the trench depth was about 3000 Å, the voltage drop along common source line 12 at the $7^{th}$ cell 12g was more than 330 mV, and more than 380 mV at the $8^{th}$ cell 12h. In the case where the depth of trench 19 was about 4000 Å, the voltage drop along common source line 12 at the $6^{th}$ cell 12f was about 350 mV. Such large voltage drops as a percentage of the operating voltage can cause read and/or write errors and can adversely affect the speed of the flash memory device.

In order to solve such source line resistivity problems, the common source line is formed with a more conductive material (e.g., a metal, metal nitride or silicide) in the present invention. The flash memory and a method for manufacturing the same according to the embodiment of the present invention will now be described with reference to FIGS. 2, 5a to 5c, 6a to 6d and 7a to 7d in detail.

Figure 5A:
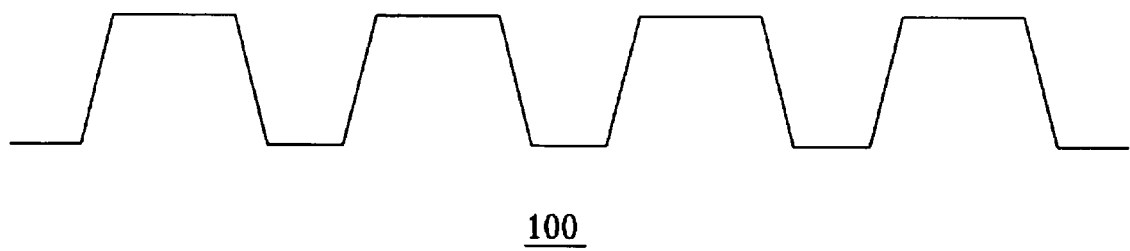
FIGS. 5a to 5c are cross-sectional views, cut along the line III–III' of FIG. 2, for illustrating the steps of forming the common source lines in the method for manufacturing the memory cell in accordance with the present invention.
Figure 5B:
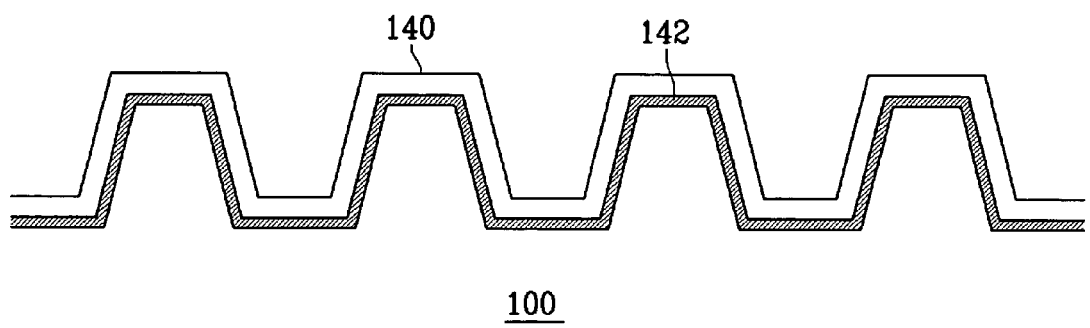
Figure 5C:
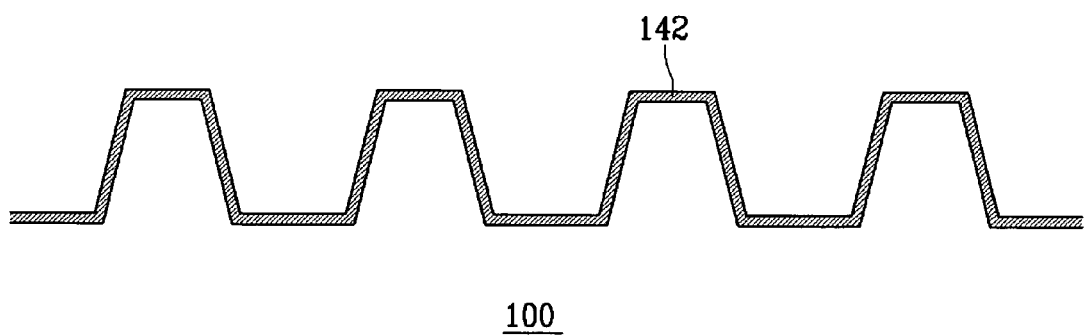

FIGS. 5a to 5c are cross-sectional views for illustrating the steps of forming the common source lines in the method for manufacturing the memory cell in accordance with the present invention. The trench lines 19a–c are formed in parallel on the semiconductor substrate 100 in accordance with known techniques (e.g., STI, comprising the steps of etching a plurality of trenches, filling the trenches with one or more dielectric materials, and removing any excess dielectric materials from regions outside and over the trenches, typically by chemical-mechanical polishing [CMP]). Here, FIG. 2 shows that the trench lines 19a–c are formed in parallel in a bit line (BL) direction, and FIG. 5a shows the trench (e.g., 19a) as a cross-section of the trench line after etching, but before filling with any dielectric material(s).

Next, referring to FIGS. 2 and 6a, a gate oxide film is formed on regions of the semiconductor substrate 100 other than at the trench lines 19a–c, and gate lines 13 are formed on portions of the trench lines 19a–c and the gate oxide film in a direction perpendicular to the trench lines 19a–c (i.e., in parallel with the word line WL) Referring now to FIG. 6a, the gate line 13 preferably comprises polycrystalline silicon ("polysilicon") layer, and the flash memory can be fabricated by sequentially forming a first polycrystalline silicon layer 130, a complex dielectric layer 131 such as an oxide-nitride-oxide (ONO) film, and a second polycrystalline silicon layer 132. However, when the flash memory cell includes the complex dielectric (e.g., ONO) layer 131, the first polysilicon layer 130 is not necessary, and when the flash memory cell includes first and second polysilicon layers 130 and 132, the complex dielectric (e.g., ONO) layer is not necessary and may be replaced with a simple dielectric (e.g., silicon dioxide) layer 131 (e.g., the first polysilicon layer 130 may be a "floating gate"). Referring back to FIG. 2, after formation of the gate 13, conventional source/drain regions 12 and 14 may be formed by conventional ion implantation.

Next, as shown in FIGS. 5a and 6b, the surface of the substrate 100 is exposed by etching out the dielectric materials of the gate oxide film and in the trenches 19a–c between adjacent gate lines 13 (e.g., along line III—III in FIG. 2). Referring to FIG. 6b, the etching process is carried out using a mask 60 for SAS 12 which exposes the substrate 100 between adjacent gate lines 13 and a part of each such gate line 13. Continuing to refer to FIG. 2, the exposed area boundary line of the mask is aligned in parallel with the gate line 13 on an upper surface of the gate line 13. The area exposed by the mask defines a self-aligned region 12 for forming the common source line 12 (see FIG. 2) between adjacent gate lines 13 by exposing the substrate 100 between the adjacent gate lines 13 that was previously covered by dielectric material in parts of trench lines 19a–c and the gate oxide film. As shown in FIG. 5a, after the etching process is completed, the surface of the substrate 100 is exposed along the common source line formation area, including in sections of the trenches 19a–c. The dielectric material of the trench line is selectively etched (i.e., under conditions such that the etching speed of the oxide film is faster than that of the semiconductor substrate 100). That is, by adopting high etching selectivity of the oxide film relative to the substrate 100, only the area of the oxide film between the adjacent gate lines 13 (FIG. 2) is etched out.

Alternatively, as shown in FIG. 7a, after formation of polysilicon layers 130 and 132 and dielectric layer 131 on trench line 19a, a self-aligned drain mask 160 may be formed by conventional photolithography, and polysilicon layers 130 and 132 and dielectric layer 131 may be removed from locations over the transistor drain regions (e.g., 14 in FIG. 2) of the substrate 100 by conventional etching to form one sidewall of the nonvolatile transistor(s) defined in part by gate 13. Then, as shown in FIG. 7b, after conventional ion implantation to form transistor drain regions (e.g., 14 in FIG. 2), a SAS mask 60 may be formed by conventional photolithography, and polysilicon layers 130 and 132, dielectric layer 131 and the exposed dielectric material in trench lines 19a–19c may be removed from the SAS region 12 over the substrate 100 by conventional etching, thus forming gate 13 and exposing the substrate 100 in the SAS region 12.

Next, as shown in FIG. 5b, a conductive film 140 comprising a conductive material (e.g., that can form a conductive, self-aligned silicide [a so-called "salicide"] by combining with the silicon) is deposited, and if a salicide is desired, annealed to form salicide layer 142. Also, as shown in the drawing, the self-aligned silicide layer 142 is formed between the conductive film 140 and the substrate 100. The conductive layer 140 may comprise one or more conductive materials (e.g., Ti, Co or W alone, or a bilayer such as Ti/TiN [the Ti of which may also form a silicide], or a multi-layer such as Co/Ti/TiN), and the annealing process is preferably carried out at a temperature in the range of 200–750° C. Referring to FIGS. 6c and 7c, conductive film 140 is shown blanket-deposited over the entire device, with salicide layer 142 in SAS region 12. In the embodiment of FIG. 6c, partial silicide layers 144 and 146 may be respectively formed in the polysilicon layers 130 and 132 of gate 13. Such partial silicide layers 144 and 146 do not adversely affect the performance or subsequent processing of the flash memory device(s), but they can be substantially avoided in the embodiment of FIG. 7c.

Next, as shown in FIGS. 5c, 6d and 7d, the SAS for the flash memory is completely fabricated with post processes after leaving the silicide layer 142 at an area on which the common source line 12 is formed by sequentially removing the conductive film 140 and the SAS mask. Alternatively, the SAS mask may be removed prior to depositing conductive film 140, and conventional photolithography can be used to mask the conductive film 140 along the common source lines, thereby exposing conductive films in regions other than in the common source lines for removal by, e.g., selective etching, and permitting conductive film 140 to remain as part of the common source line 12.

Accordingly, in the flash memory cell and the method for manufacturing the same according to one embodiment of the present invention, the common source line 12 (see FIG. 2) is formed from the conductive metal silicide layer 142. By forming the self-aligned common source line 12 from the silicide layer 142 and/or other conductive material in the flash memory and the method for manufacturing the same, it is possible to reduce the resistance value of the common source line 12 to approximately 3–5 Ω so as to improve the program characteristics and reading speed. Also, since the contact region for the common source line can be minimized, it is possible to reduce the size of the device by as much as 10%. In one implementation, a chip size reduction of 6.3% was determined.

As described above, in the present invention, the common source line region is formed as a silicide or other conductive layer by depositing and (optionally) annealing the conductive film on the SAS region such that it is possible to dramatically reduce the resistance of the common source line, resulting in enhancement of the device characteristics. Also, since the contact area of the common source region can be minimized, it is possible to reduce or minimize the size of the device.

What is claimed is:

1. A flash memory cell comprising:
   a) trench lines on a semiconductor substrate;
   b) a gate oxide film in areas on the semiconductor substrate other than over the trench lines;
   c) gate lines on portions of the trench line and gate oxide film, the gate lines being perpendicular to the trench lines;
   d) a common source line parallel to the gate lines and between adjacent gate lines, the common source line comprising a conductive metal, metal silicide and/or metal nitride layer.

2. The flash memory cell of claim 1, wherein the gate lines comprise a first polycrystalline silicon layer.

3. The flash memory cell of claim 2, wherein the gate lines further comprise a dielectric layer on said first polycrystalline silicon layer, and a second polycrystalline silicon layer on said dielectric layer.

4. The flash memory cell of claim 2, comprising an oxide-nitride-oxide film between said semiconductor substrate and said first polycrystalline silicon layer.

5. The flash memory cell of claim 4, further comprising a second polycrystalline silicon layer between said gate oxide film and said first polycrystalline silicon layer.

6. The flash memory cell of claim 1, wherein the trench lines are parallel with a bit line and the gate lines are parallel with a word line.

7. The flash memory cell of claim 1, wherein the common source line comprises a self-aligned common source line.

8. The flash memory cell of claim 7, wherein the self-aligned common source line comprises a metal salicide layer.

9. The flash memory cell of claim 8, wherein the common source line comprises a metal layer on said metal salicide layer.

10. The flash memory cell of claim 9, wherein the common source line comprises a metal nitride layer on said metal layer.

11. The flash memory cell of claim 10, wherein said metal nitride layer comprises a nitride of the metal of said metal layer.

12. The flash memory cell of claim 1, wherein the common source line comprises a metal silicide layer.

13. The flash memory cell of claim 12, wherein the metal silicide layer comprises cobalt, titanium or tungsten silicide.

14. The flash memory cell of claim 13, wherein the metal silicide layer comprises cobalt silicide.

15. The flash memory cell of claim 1, wherein the common source line comprises a metal layer.

16. The flash memory cell of claim 15, wherein the metal layer comprises titanium.

17. The flash memory cell of claim 1, wherein the common source line comprises a metal nitride layer.

18. The flash memory cell of claim 17, wherein the metal nitride layer comprises titanium nitride.

19. A method for manufacturing a flash memory cell comprising:
   a) forming trench lines on a semiconductor substrate;
   b) forming a gate oxide film on the substrate in areas other than the trench lines;
   c) forming gate lines perpendicular to the trench lines, on portions of the trench lines and the gate oxide film;
   d) removing dielectric material in parts of the trench line and the gate dielectric film between the adjacent gate lines to define a common source line region; and
   e) depositing a conductive film on the common source line area.

20. The method of claim 19, wherein said conductive film comprises a metal, and said method further comprises annealing said metal and said substrate to form a silicide layer in the common source region.

21. The method of claim 19, wherein the trench lines are parallel with a bit line and the gate lines are parallel with a word line.

22. The method of claim 19, wherein the conductive film comprises a metal and/or a metal nitride.

23. The method of claim 19, wherein the conductive film comprises Co, Ti and/or TiN.

24. The method of claim 20, wherein said annealing is carried out at a temperature in the range of 200–750° C.

25. The method of claim 20, further comprising removing a remaining conductive film after annealing.

* * * * *